US005476716A

United States Patent [19]

Gallo

[11] Patent Number: 5,476,716
[45] Date of Patent: * Dec. 19, 1995

[54] FLAME RETARDANT EPOXY MOLDING COMPOUND, METHOD AND ENCAPSULATED DEVICE

[75] Inventor: Anthony A. Gallo, Olean, N.Y.

[73] Assignee: The Dexter Corporation, Olean, N.Y.

[*] Notice: The portion of the term of this patent subsequent to Aug. 20, 2008, has been disclaimed.

[21] Appl. No.: 24,630

[22] Filed: Mar. 1, 1993

Related U.S. Application Data

[63] Continuation-in-part of Ser. No. 811,093, Dec. 20, 1991, abandoned, and Ser. No. 810,627, Dec. 19, 1991, abandoned, which is a division of Ser. No. 590,247, Sep. 28, 1990, Pat. No. 5,041,234, which is a continuation-in-part of Ser. No. 418,757, Oct. 5, 1989, Pat. No. 5,041,251, which is a continuation-in-part of Ser. No. 256,547, Oct. 17, 1988, abandoned, said Ser. No. 811,093, is a division of Ser. No. 590,247.

[51] Int. Cl.$^6$ ................................. B32B 27/38
[52] U.S. Cl. ................. 428/413; 257/702; 427/96; 523/458; 523/460; 523/466
[58] Field of Search ..................... 523/458, 460, 523/466; 428/413; 257/702; 427/96

[56] References Cited

U.S. PATENT DOCUMENTS

| | | | |
|---|---|---|---|
| Re. 31,214 | 4/1983 | Petrow et al. | 524/411 |
| 2,879,257 | 3/1959 | Walter et al. | 260/45.9 |
| 3,856,890 | 12/1974 | Biddell | 260/897 |
| 3,860,523 | 1/1975 | Petrow et al. | 252/8.1 |
| 3,909,485 | 9/1975 | Hongo et al. | 525/438 |
| 3,912,792 | 10/1975 | Touval | 260/863 |
| 3,915,926 | 10/1975 | Wambach | 260/40 |
| 3,920,459 | 11/1975 | Allen | 106/15 |
| 3,928,277 | 12/1975 | Wicker | 260/37 |
| 3,950,456 | 4/1976 | Newcombe | 260/880 |
| 3,956,231 | 5/1976 | Moore et al. | 523/205 |
| 3,983,185 | 10/1976 | Dorfman et al. | 260/863 |
| 4,006,114 | 2/1977 | Carlson | 260/28.5 |
| 4,024,318 | 5/1977 | Forster et al. | 428/519 |
| 4,042,550 | 8/1977 | Tuller et al. | 523/457 |
| 4,075,154 | 2/1978 | Itoh et al. | 260/37 |
| 4,127,559 | 11/1978 | Newcombe | 260/47.75 |
| 4,137,212 | 1/1979 | Theyson et al. | 260/37 |
| 4,155,949 | 5/1979 | Kamiyama et al. | 260/857 |
| 4,156,068 | 4/1979 | Taniyama et al. | 524/121 |
| 4,205,142 | 5/1980 | Baer | 525/166 |
| 4,221,893 | 9/1980 | Behar et al. | 528/102 |
| 4,248,920 | 2/1981 | Yoshizumi et al. | 525/484 |
| 4,278,581 | 6/1981 | Nakazawa et al. | 260/29.6 |
| 4,282,136 | 9/1981 | Hunt et al. | 260/38 |
| 4,339,556 | 7/1982 | Baer | 523/220 |
| 4,417,018 | 11/1983 | Ogawa et al. | 524/261 |
| 4,421,877 | 12/1983 | Alvino et al. | 523/416 |
| 4,529,769 | 7/1985 | Johnson et al. | 514/414 |
| 4,542,164 | 9/1985 | Nishiok et al. | 524/109 |
| 4,544,688 | 10/1985 | Salensky et al. | 523/458 |
| 4,618,636 | 10/1986 | Muench et al. | 524/176 |

(List continued on next page.)

FOREIGN PATENT DOCUMENTS

| | | |
|---|---|---|
| 48-019633 | 3/1973 | Japan. |
| 51-024676 | 2/1976 | Japan. |
| 54-003152 | 1/1979 | Japan. |
| 56-002340 | 1/1981 | Japan. |
| 56-034746 | 4/1981 | Japan. |
| 59-129253 | 7/1984 | Japan. |
| 60-120779 | 6/1985 | Japan. |
| 61-138619 | 6/1986 | Japan. |
| 61-625514 | 7/1986 | Japan. |
| 61-163922 | 7/1986 | Japan. |
| 1124005 | 11/1984 | U.S.S.R.. |

OTHER PUBLICATIONS

Applied Polymer Science, Tess and Poehlein, eds. 1985, pp. 306, 308 and 313.

Xiaoming et al., "Studies on Characteristics and Mechanisms of X–MoO$_3$ Synergism in Fire–Retarded Epoxy Resin", J. App. Poly. Sci., 45:1145–1149 (1992).

Kroenke et al., "Melaminium Molybdate Smoke and Fire Retardants for Poly(vinyl chloride)", J. App. Poly. Sci., 32(3):4155–4168, Aug., 1986.

Handa et al., "The Synergistic Effects of Antimony Trioxide and Other Metal Oxide or Hydroxide in Plasticized Flame Retardant Polypropylene and Plasticized PVC", J. Fire Retard. Chem., 8(4):171–192, 1981.

Trask et al., "A Synergistic Molybdenum–based Fire–Retardant System for Outdoor Cotton Fabric", Proc. Symp. Text. Flammability, 6:304–316, 1978.

Ainger et al., "Improvements to Microcircuit Reliability by the Use of Inhibited Encapsulants", A.C.S. Symp. Series, 242:313–322, 1984.

Raymond, T., "Avoiding Bond Pad Failure Mechanisms in Au–Al Systems", *Semiconductor Int'l*, pp. 152–158, Sep., 1989.

Moltzan et al., "The Evolution of Epoxy Encapsulation Compounds for Integrated Circuits: A User's Perspective, Polymer for High Technology Electronics and Protonics", ACS Sym. Series No. 346, p. 521, Sep. 1–12, 1986.

Lee and Neville, "Handbook of Epoxy Resins", 1967 pp. 12–6.

H. Rumpel, et al., Z. Naturforsch., B: Anorg. Chem., Org. Chem., 33–39 (1978).

Berry, P. et al., J. Chem. Soc., Dalton Trans., 1983–9 (1983).

Swanson, Fuyat, Natl. Bur. Stand. (U.S.). Circ. 539, 331 (1954).

*Primary Examiner*—Melvyn I. Marquis
*Assistant Examiner*—D. Aylward
*Attorney, Agent, or Firm*—Pennie & Edmonds

[57] ABSTRACT

A flame retardant epoxy molding compound comprises an epoxy, a hardener preferably of the novolac or anhydride type, a catalyst, a mold release agent, preferably a filler, preferably a colorant, preferably a coupling agent, an organic compound containing a halogen (which can be part of the resin or the hardener), and an oxidizing refractory metal oxide, preferably on oxidizing metal oxide of an element selected from the Group VIA of the Periodic Table. The flame retardant epoxy molding compounds when used to encapsulated semiconductor devices have synergistic flame retardant properties.

34 Claims, 4 Drawing Sheets

U.S. PATENT DOCUMENTS

| | | | |
|---|---|---|---|
| 4,664,563 | 5/1987 | Christmann | 523/130 |
| 4,668,719 | 5/1987 | Kato et al. | 523/458 |
| 4,675,356 | 6/1987 | Miyata | 524/424 |
| 4,684,721 | 5/1987 | Wang et al. | 525/507 |
| 4,710,531 | 12/1987 | Dozzi et al. | 524/239 |
| 4,710,796 | 12/1987 | Ikeya et al. | 357/72 |
| 4,716,184 | 12/1987 | Kagawa et al. | 523/460 |
| 4,725,638 | 2/1988 | Ellmann et al. | 524/377 |
| 4,743,044 | 5/1988 | Skipper et al. | 524/437 |
| 4,849,467 | 7/1989 | Shorr et al. | 524/104 |
| 4,965,657 | 10/1990 | Ogata et al. | 525/527 |
| 4,994,515 | 2/1991 | Washiyama et al. | 524/504 |
| 5,041,254 | 8/1991 | Gallo | 264/272.17 |
| 5,104,604 | 4/1992 | Gallo | 264/272.17 |

FLAME RETARDANT EPOXY MOLDING COMPOUND, METHOD AND ENCAPSULATED DEVICE

This is a continuation-in-part of United States patent application Ser. Nos. 07/811,093, filed Dec. 20, 1991 abandoned and 07/810,627, filed Dec. 19, 1991, abandoned, which in turn are both divisional applications of United States Patent application Ser. No. 07/590,247, filed Sep. 28, 1990, now U.S. Pat. No. 5,041,234, which is in turn a continuation-in-part application of United States patent application Ser. No. 07/418,757, filed Oct. 5, 1989, now U.S. Pat. No. 5,041,251, which is in turn a continuation-in-part of Ser. No. 256,547, filed Oct. 17, 1988, now abandoned.

BACKGROUND OF THE INVENTION

1.1. Technical Field

The present invention relates to flame retardant thermosetting epoxy molding compounds of the type comprising an epoxy, a hardener, a catalyst, a mold release agent, a filler, optionally a colorant, optionally a coupling agent and a flame retardant system. The flame retardant system comprises an oxidizing refractory metal oxide, particularly an oxidizing metal oxide of an element selected from Group VIA of the Periodic Table, and an organic compound containing halogen. The flame retardant thermosetting epoxy molding compound may be used, for example, to encapsulate a semiconductor device.

The present invention also relates to a method of encapsulating a semiconductor device by heat curing around a semiconductor device an encapsulating compound comprising an epoxy, a hardener, a catalyst, a mold release agent, a filler, optionally a colorant, optionally a coupling agent and a flame retardant system. The flame retardant system comprises an oxidizing refractory metal oxide, particularly an oxidizing metal oxide of an element selected from Group VIA of the Periodic Table, and an organic compound containing halogen.

The present invention also relates to an encapsulated semiconductor device wherein the encapsulant is the flame retardant thermosetting epoxy molding compound described above, the flame-retardant system comprising an oxizidizing refractory metal oxide, particularly an oxidizing metal oxide of an element selected from Group VIA of the Periodic Table, and an organic compound containing halogen.

A flame-retardant system comprising an organic compound containing a halogen and an oxidizing refractory metal oxide, particularly an oxidizing metal oxide of an element selected from Group VIA of the Periodic Table, was unexpectedly found to have flame retardant synergism when incorporated in thermosetting epoxy molding compounds used for encapsulating a semiconductor device.

The halogen-containing organic compound may be a separate ingredient, but is preferably a part of either the epoxy or the hardener. The halogen-containing organic compound can also be a halogen-containing compound which is chemically incorporated into the product of the epoxy resin and the hardener upon setting or part of other ingredients such as the lubricant or the colorant.

The flame retardant system may also comprise, optionally, antimony pentoxide and sodium. The flame retardant system may also comprise, optionally, basic magnesium oxide compound to reduce corrosion of metal conductor lines and pads of the semiconductor device.

The term "epoxy molding compounds" as used herein means epoxy molding compound conventionally known in the art including any material containing two or more reactive oxirane groups. For example, the epoxy molding compound may have two or more epoxy groups in one molecule, including glycidyl ether type such as, phenol novolac type; cresol novolac type and the like; glycidyl-ester type; alicyclic type; heterocyclic type and halogenated epoxy resins, etc. The epoxy resins may be used either singly or as a mixture of two or more resins.

Similarly, the term "hardener" as used herein means an epoxy novolac molding compound including, but not limited to, any phenol-derived and substituted phenol derived novolac hardener and anhydride hardener conventionally used as hardener for epoxy resins. For example, phenolic novolacs, and cresolic novolacs, are most suitable. The epoxy novolac molding compounds may be used either singly or as a mixture of two or more compounds.

The term "catalyst" as used herein means a catalyst appropriate to the hardener used to promote the curing of the present composition. Such catalysts include, but are not limited to, basic and acidic catalysts such as the metal halide Lewis acids, e.g., boron trifluoride, stannic chloride, zinc chloride and the like, metal carboxylate-salts such as stannous octoate and the like; and amines, e.g., triethylamine, imidazole derivatives and the like. The catalysts are used in conventional amounts such as from about 0.1 to 5.0% by weight of the combined weight of epoxy and hardener.

The term "mold release agents" as used herein means chemical agents commonly used to assist the release of the cured epoxy molding compounds from the mold. For example, carnauba wax; montanic acid ester wax; polyethylene wax; polytetrafluoroethylene wax; glyceral monostearate; metallic stearates; paraffin waxes and the like are suitable.

The term "fillers" as used herein means one or more of the conventional fillers such as silica, calcium carbonate, calcium silicate, aluminum oxide, glass fibers, clay, and the like. The preferred filler is silica or a mixture of predominantly silica with other filler(s). The fillers usually are used in at least 50 percent by weight of the molding compound.

The term "colorant" as used herein includes colorant commonly used in epoxy molding compound, such as carbon black, pigments, dyes and the like.

The term "coupling agent," as used herein means a coupling agent known to improve dry electrical properties of the compound. The coupling agents may be of the silane type, characterized by the formula $R'Si(OR)_3$; where $R'$ represents an organo-functional group such as amino, mercapto, vinyl, epoxy or methacryloxy, and OR represents a hydrolyzable alkoxy group attached to the silicon. Preferred coupling agents are described in U.S. Pat Nos. 4,042,550 and 3,849,187, of which the descriptions are incorporated herein by reference.

The term "halogen-containing organic compound" or "organic compound containing halogen", as used herein, includes organic compound in which the halogen is present from any source including halogenation of a component or its precursor (such as a monomer) or by addition of halogen-containing monomers by reactions in which the halogen is not completely removed.

The halogen-containing organic compound used in a is preferably of the reactive type and further preferably has, as halogen, chlorine or bromine. Exemplary halogenated organic compounds are those types of polyglycidyl ether of bromophenolformaldehyde novolac, commercially sold by Nippon Kayaku under the tradename "BREN™," those described in U.S. Pat. Nos. 4,042,550 and 4,282,136, of which the descriptions are incorporated herein by reference and include halogenated bisphenol A and derivatives of bisphenol A such as tetrabromobisphenol A, and glycidyl ethers of halogenated resins such as the diglycidyl ether of tetrabromobisphenol A.

Preferred is meta-brominated cresol epoxy novolac available from the Dow Chemical Co. under the tradename "Stable Bromine Cresol Epoxy Novolac" (71842.00L type or 71970.00 type, production no. R0544-91091-21-1. These are described in U.S. Pat. Nos. 4,727,119 and 4,731,423). The 71842.00L type is of the general formula:

The 71970.00 type contains the following ingredients:

| | |
|---|---|
| Diglycidylether of Dibromotetramethylbisphenol | 0–8% |
| Diglycidylether of Tribromotetramethylbisphenol Cas No. 108935-90-6 | 8–40% |
| Diglycidylether of Tetrabromotetramethylbisphenol Cas No. 72436-58-9 | 0–2% |
| Reaction product of cresol, formaldehyde & epichlorohydrin Cas No. 064425-89-4 | 60–90% |

The halogen containing organic compound may be a separate additive or may be contained in one or more of the organic components of the molding compound, especially the epoxy or the hardener, or possibly other components such as the lubricant, or the colorant or the filler (if organic).

Exemplary of reactive halogen-containing organic compounds which are part of the epoxy resin are metabrominated phenolics such as meta-brominated cresol epoxy novolac.

The term "oxidizing" means capable of at least partially oxidizing residual reduced sites on integrated circuit components where two different metals are in contact with each other, such as conductor lines, pads and ball-bonds. For example, for an integrated circuit having an $Al_2O_3$ surface layer which passivates the metallic aluminum of the integrated circuit, oxidizing of the residual reduced sites thickens and strengthens the passivating surface layer.

The term "refractory metal oxide" means any oxide of any metal or alloy of any metal recognized as a refractory metal in the Manual of Classifiaction of Patents at page 75-1 of the December 1991 edition. These include titanium, zirconium, hafnium, vanadium, niobium, columbium, tantalum, chromium, molybdenum and tungsten.

The term "metal oxide of an element selected from Group VIA of the Periodic Table" means any Group VIA metal or alloy in any oxide form. Preferably, the metal oxide is tungsten or molybdenum. More preferably, the metal oxide is tungsten trioxide or molybdenum trioxide, both sold by Johnson Matthe Chemicals Ltd.

The term "antimony pentoxide" as used herein means antimony pentoxide in any available form. Preferably, antimony pentoxide used is Nyacol A1590 commercially sold by the Nyacol Division of P. Q. Corporation which has a sodium content of 0.03 to 0.06% by weight of the antimony pentoxide.

The term "magnesium oxide compound" as used herein means any magnesium oxide in any available form capable of neutralizing the acidity of the antimony pentoxide and thereby reducing the corrosion of the metal semiconductor device lines and pads, especially in regions where two different metals are in contact with each other. Preferably, the magnesium oxide compound is magnesium aluminum carbonate hydrate commercially sold by Kyowa Chemical Industry Co. under the trade name "DHT-4A".

1.2. Description of Background Art

Epoxy resin compounds have often been used for encapsulation of semiconductor devices such as integrated circuits (IC), large scale integrated circuits (LSI), transistors and diodes, etc., or other electronic components. Such encapsulants generally comprise an epoxy, a hardener, a catalyst, a mold release agent, optionally a filler, optionally a colorant and sometimes a coupling agent.

Exemplary formulations of these ingredients are described in U.S. Pat. No. 4,710,796 to Ikeya et al., U.S. Pat. No. 4,282,136 to Hunt et al., U.S. Pat. No. 4,042,550 to Nussbaum et al. and references cited therein and in Raymond, T. "Avoiding Bond Pad Failure Mechanisms in Au—Al Systems" *Semiconductor Int'l.* p. 152–158, September 1989. Recently, the electronic industries require these epoxy molding compounds be flame retardant. Additives including halogenated compounds, transition metal oxides and hydrated alumina to improve the flame retardancy, as measured for example by Underwriters Laboratory Test 94V-0 of 1/16" bar, have been reported. However, at high temperatures, these flame retardant additives detract from the compatibility of the encapsulant with semiconductor devices.

U.S. Pat. No. 4,710,796 to Ikeya et al. teaches a resin for encapsulating semiconductor device comprising an epoxy resin, curing agent, organic phosphine compound and at least one antimony oxide.

U.S. Pat. No. 4,042,550 to Nussbaum et al. teaches encapsulating semiconductors using epoxyanhydride molding compounds with secondary fillers including antimony trioxide or antimony tetraoxide and halogenated compounds in flame retardant systems.

Similarly, U.S. Pat. No. 4,282,136 to Hunt et al. describes the use of synergistic flame retardants consisting of halogen-containing organic compounds and antimony pentoxide for encapsulating semiconductors. The reference teaches that an encapsulant employing such a flame retardant system, when used to encapsulate a semiconductor device, has improved high temperature compatibility compared to similar molding compounds with antimony trioxide or antimony tetraoxide. However, the prior art epoxy molding compounds contain a high percent of sodium which is known to cause poor performance in semiconductor devices due to current leakage. See Moltzan et al., "The Evolution of Epoxy Encapsulation Compounds For Integrated Circuits: A User's Perspective, Polymer for High Technology Electronics and Protronics", ACS Sym. Series No. 346, p. 521, Sep. 7–12, 1986.

Raymond describes the necessity of IC manufacturers keeping Br in molding compounds at a low level (around 0.6–0.8%.) based on poor dry heat reliability results with a high Br compound (1.0%).

Prior to the present invention, there has never been suggested or disclosed the use of an epoxy molding compound used to encapsulate semiconductor devices which compound has a flame retardant system comprising an oxidizing refractory metal oxide and a halogen containing organic compound.

Molybdenum compounds have been used with polyvinyl chloride for smoke suppression. See e.g., Moore et al., "Molybdenum Compounds as Smoke Suppressants", Proc. Int. Conf. Fire Saf., Vol. 12, p. 324–339, 1987; Kroenke et al., "Melaminium Molybdate Smoke and Fire Retardants for Poly(vinyl chloride)", Journal of Applied Polymer Science, Vol. 32, no. 3, p. 4155–4168, Aug., 1986; Handa et al., "The Synergistic Effects of Antimony Trioxide and Other Metal Oxide or Hydroxide in Plasticized Flame Retardant Polypropylene and Plasticized PVC", J. Fire Retard Chem., Vol. 8, no. 4, p. 171–192, 1981.

Additionally, molybdenum has been found to be a flameproofing synergist in applications unrelated to epoxy molding compounds for encapsulating electronic devices, such as in flameproofing cotton fabric or unsaturated polyesters See e.g., Trask et al., "A Synergistic Molybdenum-based Fire-Retardant System for Outdoor Cotton Fabric", Proc. Symp. Text. Flammability, Vol. 6, p. 304– 316, 1978; Skinner et al., "Flame Retardant Synergism Between Molybdenum and Halogen-containing Compounds in Unsaturated Polyesters", Fire Mater., Vol. 1, no. 4, p. 154–159, 1976.

Ammonium tungstate has been found to improve Integrated Circuit performance, but no flame retardant synergism has been attributed to such compound. See, Ainger et al., "Improvements to Microcircuit Reliability by the Use of Inhibited Encapsulants", A.C.S. Symp. Series, Vol. 242, pp. 313–322, 1984.

While the prior art flame retardant combinations used in epoxy molding compounds that encapsulate semiconductor devices provides reasonable flame retardance and satisfactory compatibility on electronic devices, a need clearly exists for flame retardant epoxy molding compounds of all types with improved high temperature compatibility and performance, and lower cost and toxicity.

Accordingly, it is an object of the present invention to provide a flame retardant thermosetting epoxy molding compound that is compatible with semiconductor devices at high temperatures.

It is yet another object of the present invention to provide an improved method of encapsulating a semiconductor device.

It is yet another object of the present invention to provide an improved encapsulated semiconductor device. These and other objects of the invention, as well as a fuller understanding of the advantage thereof, can be had by reference to the following descriptions and claims.

2. SUMMARY OF THE INVENTION

The foregoing objects are achieved according to the present invention by an improved epoxy molding compound comprising:

(a) about 5–25 percent by weight of compound of an epoxy;

(b) about 4–20 percent by weight of compound of a resin hardener;

(c) an effective amount of a catalyst for the reaction between said epoxy resin and said hardener in an amount of from about 0.1 to 10% by weight of the combined weight of epoxy and hardener;

(d) an effective amount of a mold release agent for the release of the cured molding compound from a mold in an amount of between about 0.01 and about 2 percent by weight of composition;

(e) between about 50 and 85 percent by weight of composition of a filler; and (f) a flame retardant system of:
  (1) a refractory metal oxide; and
  (2) a reactive organic compound containing halogen said reactive organic compound being a separate compound or being contained in one or more of said components (a)–(e) of said epoxy molding compound.

The improved epoxy molding compounds of the present invention are suitable for use in encapsulating a semiconductor device.

According to the present invention, the said improved epoxy molding compounds may be prepared by any conventional method. For example, the ingredients may be finely ground, dry blended and then densified on a hot differential roll mill, followed by granulation. Generally, the ingredients (or any portion of them) may be prepared as a fine powder, fed directly into a compounding device such as an extruder prepared as a premix of raw materials. If less than all of the ingredients are present in the initial form, the remainder of the ingredients can be added prior to or during densification.

Densification can be by mechanical compacting using a preformer or a combining mill in the case of a fine powder, or by an extruder or differential roll mill in the case of the fine powders, direct feed or premix. Premixes or densified forms (such as preforms and granular forms), containing less than all of the ingredients can also be fed to the ultimate mold in the system with the remaining ingredients in a similar or different form.

The present invention includes flame retardant molding compounds in any physical form or even as systems of two or more components. Where two or more components are used, one should contain the epoxy, the other the hardener. Preferably, the catalyst is in the hardener component to avoid catalyzed homopolymerization of the epoxy.

In a preferred embodiment, in the laboratory, the dry ingredients of the formula are preground to a fine powder and then mixed in a large plastic bag. The liquid ingredients (i.e., the silane coupling agents) are added to dry ingredients and the mixture is mixed again by hand. The mixture is then treated on a large two-roll mill (one roll heated to about 90° C. and the other cooled with tap water) until a uniform sheet (about 6" wide by 24" long) is obtained. The sheet is allowed to cool and then ground to a fine powder.

In another preferred embodiment, in the pilot plant and during large scale production, the dry ingredients are mixed in a large hopper, the liquid ingredients are added in a homogeneous manner to ensure blending, and mixing continues. This mixture is then extruded (with heating) to give a continuous sheet which is cooled and grounded. The final ground powder can be used as is, or compacted (densified) in a preformer to give tablets (preforms) of desired shape and size.

These compounds may be molded into various articles by application of the appropriate temperature and pressure. For example, molding conditions for the encapsulated semiconductor of the present invention may range from about 300° to 400° F., (about 149°–204° C.), preferably about 350° to about 375° F., (about 177°–191° C.), at 400 to 1,500 psi, (about 28–105 kg/cm$^2$), for a time ranging from about 30 to 120 seconds, preferably 60 to 90 seconds.

The epoxy molding compound obtained may be used to encapsulate semiconductor devices by any conventional method. Any suitable molding apparatus may be employed, such as a transfer press equipped with a multi-cavity mold.

The ratio between the various ingredients may vary widely. In general, the epoxy will be in proportion to a novolac hardener so as to give a mole ratio of oxirane:reactive hydroxy between about 0.8 and 1.25. Similarly, the epoxy will be in proportion to an anhydride hardener so as to give a ratio of oxirane: anhydride equivalent between about 1.0 and 1.7, preferably between about 1.11 and 1.25.

The catalyst employed is generally applied at levels sufficient to harden the epoxy molding compound under anticipated molding conditions. Amounts between about 0.01 and 10 weight percent (by combined weight of epoxy and hardener) are sufficient, preferably between about 0.5 and 2.0 weight percent.

The mold release agent will be employed in amounts sufficient to give good release from the mold and also to improve the dry electrical properties of the encapsulated semiconductor device. Amounts between about 0.01 and 2 percent by weight of total compound, preferably between about 0.02 and 1 percent by weight of total compound can be used.

The total amount of filler may range from 0 up to about 85 percent of the total compound. Preferably, the filler comprises a total of more than 50 weight percent of the total compound and more preferably between about 60 and about 80 weight percent of the total compound. Preferably the filler includes silica.

Colorants, if employed, are generally in amounts sufficient to give encapsulated devices the desired color preferably black. Amounts between about 0.05% - preferably 0.1–0.5% by weight of total compound can be employed.

Coupling agents, and in particular silane coupling agents, are provided in amounts sufficient to give the desired dry electrical properties and preferably between about 0.05 and 2 weight percent by total weight of compound, more preferably between about 0.1 and 1.5 weight percent by total weight of compound.

Preferably, the halogen of the reactive organic compound having halogen is bromine. Preferably, the organic compound having halogen contains about 0.5–1.5% halogen by weight of molding compound.

Preferably, the oxidizing refractory metal oxide is an oxidizing metal oxide of an element selected from Group VIA of the Periodic Table, most preferably tungsten trioxide or molybdenum trioxide. Preferably, the formulation comprises from 0.40–2.0% of the oxidizing refractory metal oxide.

Optionally, the formulation may comprise 0.4–0.8% percentage of antimony pentoxide and 0.03–0.06% sodium content (by weight of antimony pentoxide). Further, optionally, the formulation may comprise 0.02–3.20% by weight of magnesium oxide compound, preferably, basic magnesium aluminum carbonate hydrate.

The use of a lower percentage of antimony pentoxide in the present invention is preferred because antimony compounds are expensive and at least potentially toxic.

Oxidizing refractory metal oxides, particularly oxidizing metal oxides of an element selected from Group VIA of the Periodic Table, and an organic compound containing halogen, when included as part of a flame retardant system of an epoxy molding compound for molding semiconductor devices, were found to be flame retardant synergists based on the test results as shown herein.

In the ball bond degradation test, the encapsulated devices are placed in an autoclave having a moist environment. After a number of hours, the encapsulated devices are removed from the autoclave and a hole drilled in the top thereof. Fuming nitric acid is poured into the hole to expose the bonding wire. The strength of the bond between the gold wire ball and the aluminum bonding pad is measured using a probe. The reduction in strength of the bond from the bond prior to placement in the autoclave is the measure of the % of original ball bond strength. National LF412 operational amplifiers encapsulated with epoxy molding compound comprising MoO$_3$ retained 95% of their original ball bond strength when stored in an autoclave set at 30 psi steam for 1000 hours. National LF412 operational amplifiers encapsulated with epoxy molding compound comprising WO$_3$ retained 90% of their original ball bond strength under the same conditions.

The electrical reliability of the encapsulated devices in a moist environment is determined by placing the encapsulated devices with no bias in an autoclave having a moist environment. After a number of hours, the encapsulated devices are dried and tested with an electrical tester. The time that it takes for 50% of the encapsulated devices to show a failure in any one of several electrical parameters is determined. These parameters, set by the manufacturer of the device, include, for example, the net DC input offset current for zero device output, the current from device negative input with zero output, the current from the device positive input terminal with zero output, the average of the two previous parameters, DC input offset voltage for zero device output, etc. National LF412 operational amplifiers encapsulated with epoxy molding compound comprising MoO$_3$ placed in autoclave set at 15 psi did not show 50% failure until 660 hours.

The high temperature storage life (HTSL) test assesses electrical reliability of the encapsulated devices in a dry environment. In the HTSL test, parametric shifts in voltage output levels are monitored. The temperature at which the semiconductor is stored may be varied. The voltage output levels reflect increased resistance across the ball-bonds of the devices. The improved epoxy molding formulations delay or eliminate the failure due to parameter shifts in voltage output levels of encapsulated semiconductor devices.

When the HTSL test is performed at 200° C., 5420 devices encapsulted with epoxy molding compound comprising $WO_3$ did not show 50% failure at 400 mV until 930 hours and at 250 mV until 451 hours. When the HTSL test is performed at 190° C., 74LS00 devices encapsulted with epoxy molding compound comprising $WO_3$ did not show 50% failure at 400/500 mV until more than 3000 hours and at 300/350 mV until 1900 hours. Further, when the HTSL test is set at 190° C., 74LS00 devices encapsulated with the epoxy molding compound comprising $WO_3$ showed no failure at 400/500 mV and a constant 4.0/8.0 mA current until 902 hours and no failure at 300/350 mV and a constant current of 4.0/8.0 mA until 594 hours. These reults are a significant improvement over the HTSL test results under the same conditions for the 74LS00 devices encapsulated with an epoxy molding compound comprising $S_2O_5$ and no oxidizing refractory metal oxide, which was unexpected in view of the fact that $Sb_2O_5$ is a flame retardant synergist, as shown in U.S. Pat. No. 5,041,234 of Gallo.

In the high temperature accelerated stress (HAST) test, encapsulated devices with no bias are placed in a HAST chamber set at a constant temperature. After a number of hours the encapsulated devices are dried and tested with an electrical tester. The time that it takes for 50% of the encapsulated devices to show failure in any one of several electrical paramters set by the manufacturer of the device is determined. When National LF412 operational amplifiers encapsulated with epoxy molding compound comprising $WO_3$ were placed in a HAST chamber set at 148° C./90% RH with no bias, the devices did not show 50% failure until 2650 hours.

In the T-shock cycle test, the encapsulated devices are placed in liquid nitrogen for 5 minutes and then in hot solder for 5 minutes. This cycle is continuously repeated and the parts examined for visual cracks every 5 cycles. When National LF412 operational amplifiers encapsulated with epoxy molding compound comprising $WO_3$ were tested, the devices did not show 50% failure until 245 cycles, which is a significant improvement over the same devices encapsulated with an epoxy molding compound comprising $Sb_2O_5$ and no oxidizing refractory metal oxide.

The results of these tests show that oxidizing refractory metal oxides, particularly oxidizing metal oxides of an element selected from Group VIA of the Periodic Table, and more particularly, $WO_3$ and $MoO_3$, are flame retardant synergists when added to a reactive organic compound containing a halogen in a flame retardant system of an epoxy molding compound for encapsulating semiconductor devices.

Further, the epoxy molding compounds may optionally contain from about 0.40–0.80% antimony pentoxide by weight of molding compound. This is especially surprising in view of the prior art teaching that a higher percent antimony pentoxide ($\geq 1\%$) will give formulation with better synergistic performance. One skilled in the art of molding compound systems would not be led to use about $\leq 0.8\%$ antimony pentoxide because prior art teaches use of a halogen containing organic compound with $\geq 1\%$ of pentoxide is expected to give reduced parametric failures.

In the present invention, the improved epoxy compound obtains superior results with both < and $\geq 1.0\%$ bromine content. This result is unexpected based on the prior art teachings that high levels of bromine are detrimental to high temperature reliability. One skilled in the art would not be led to use about $\geq 1.0\%$ bromine content because prior art teaches the use of $\geq 1.0\%$ bromine content is expected to give poor dry heat reliability results.

The improved epoxy molding compounds may also contain basic magnesium aluminum carbonate hydrate and antimony pentoxide in addition to the oxidizing refractory metal oxides. In particular, test results showed that compounds containing DHT-4A in addition to $WO_3$ are also flame retardant synergists.

The present invention is not restricted to the above ingredients but may include other ingredients which do not detract from flame retardant properties of the flame retardant agent. Accordingly, other organic or inorganic materials may be added under the above conditions.

DESCRIPTION OF PREFERRED EMBODIMENTS

The following nonlimiting examples further illustrate the present invention relating to an improved epoxy molding compound, method and encapsulated device. All parts are by weight unless indicated otherwise.

Examples 1–6

Epoxy encapsulants are prepared from the modified formulation A indicated in Table 1. The six encapsulants differ in the presence/absence of $MoO_3$, $Sb_2O_5$, or $Bi_2O_3$:

TABLE 1

| Description molding compound | Samples | | | | | |
|---|---|---|---|---|---|---|
| | 1 % | 2 % | 3 % | 4 % | 5 % | 6 % |
| Fused silica filler | 71.39 | 71.39 | 70.19 | 70.99 | 70.19 | 69.79 |
| Carbon black coloring | 0.20 | 0.20 | 0.20 | 0.20 | 0.20 | 0.20 |
| Epoxy resin | 13.49 | 13.26 | 13.49 | 13.49 | 13.49 | 13.49 |
| Phenolic Novolac Hardener | 9.22 | 9.10 | 9.22 | 9.22 | 9.22 | 9.22 |
| Silane coupling agent | 0.70 | 0.70 | 0.70 | 0.70 | 0.70 | 0.70 |
| catalyst | 0.35 | 0.35 | 0.35 | 0.35 | 0.35 | 0.35 |
| wax lubricants | 0.45 | 0.45 | 0.45 | 0.45 | 0.45 | 0.45 |
| Brominated Epoxy Novolac | 3.80 | 3.80 | 3.80 | 3.80 | 3.80 | 3.80 |
| $MoO_3$ | — | — | 1.60 | 0.80 | — | — |
| antimony pentoxide | 0.40 | 0.75 | — | — | — | 0.40 |
| $Bi_2O_3$ | — | — | — | — | 1.60 | 1.60 |

3.2 Examples 7–11

The properties of the cured encapsulants of Samples 1–6 are determined by total burn times of 1/16" bar according to the UL-94V-O test. The test results are summarized in Table 2.

TABLE 2

| Sample # | 1/16" Bar Total Burn Time | 94V-O Status |
|---|---|---|
| 1 | 17 sec. | pass |
| 2 | 4 sec. | pass |
| 3 | 9 sec. | pass |
| 4 | 31 sec. | pass |
| 5 | 60 sec. | fail |
| 6 | 18 sec. | pass |

A review of the data shows that $MoO_3$ and $Sb_2O_5$ are flame retardant synergists while $Bi_2O_3$ is not, by itself, a flame retardant synergist.

Examples 12–17

Figure 1:
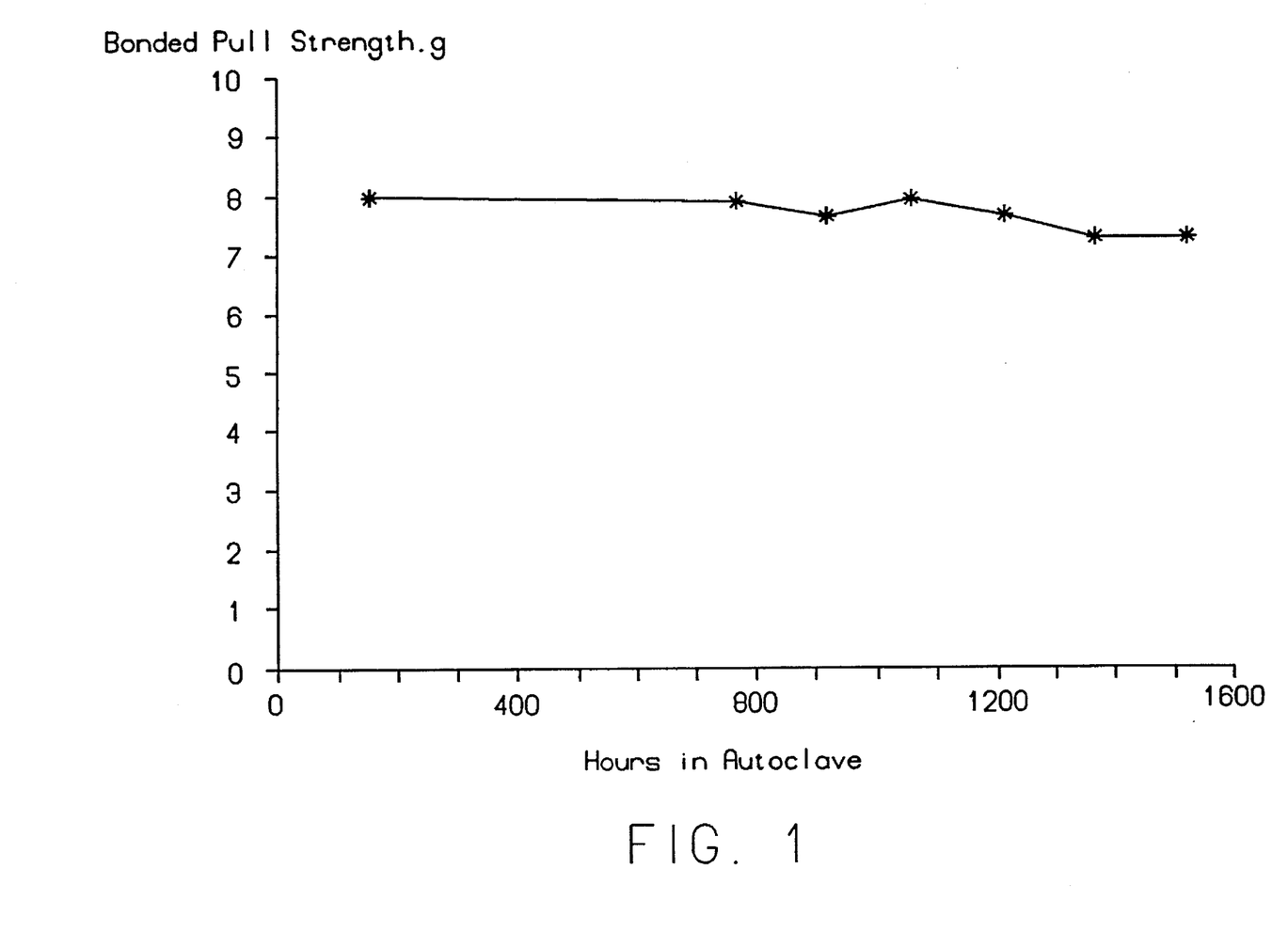
FIG. 1 describes test results of the ball bond degradation test on Example 4 as a function of time and the estimated bond pull strength at 30 psi.
Figure 2:
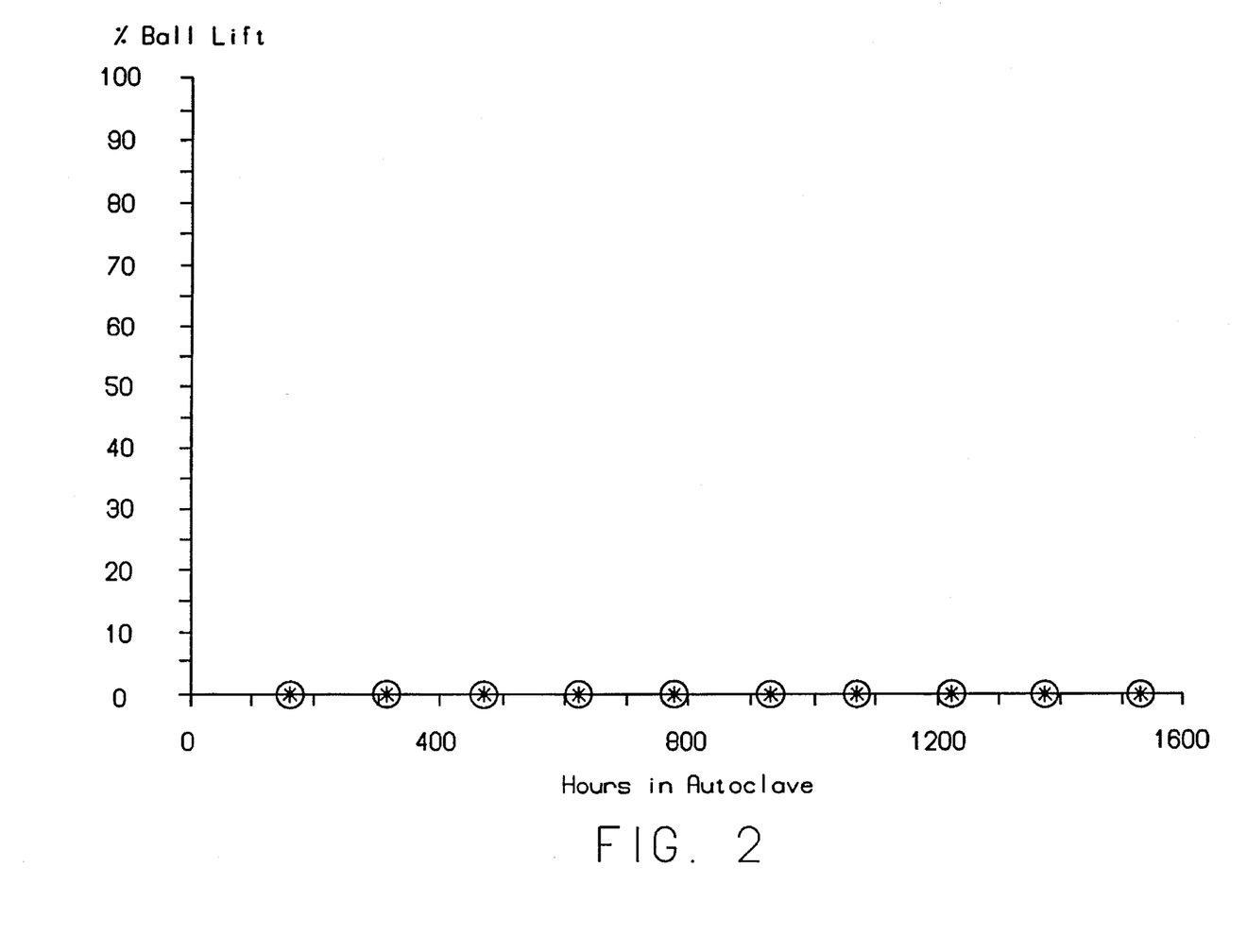
FIG. 2 describes test results of the ball bond degradation test on Example 4 as a function of time and the estimated hours of 50% occurrence of ball lift at 30 psi.

National LF412 operational amplifiers are encapsulated with the epoxy molding compounds of Sample 2, 4, 5 and 6. A ball bond degradation test is performed. In this case, the autoclave is set at 30 psi steam and the encapsulated devices are autoclaved for 1000 hours. The test results of the ball bond degradation test are summarized in Table 3 and FIGS. 1–2.

TABLE 3

| Sample # | % of original Ball Bond Strength After 1000 hrs. at 30 psi |
|---|---|
| 2 | about 95 |
| 4 | about 95 |
| 5 | 67 |
| 6 | 88 |

A review of the data shows that flame retardant systems with $Bi_2O_3$ by itself suffers significant degradation of ball bond strength after 1000 hours at 30 psi, but flame retardant systems with $Sb_2O_5$ or $MoO_3$ do not suffer significant degradation of ball bond strength after 1000 hours at 30 psi.

Examples 18–20

National LF412 operational amplifiers are encapsulated with Samples 1, 4 and 6. The electrical reliability of the encapsulated devices is tested by placing the encapsulated devices with no bias into an autoclave set at 15 psi. The test results are summarized in Table 4.

TABLE 4

| Sample # | Hours to 50% Failure 15 psi/ No bias, Parametric Failures |
|---|---|
| 1 | 660 |
| 4 | 660 |
| 6 | 1060 |

A review of the data shows both $MoO_3$ and $Sb_2O_5$ are both flame retardant synergists.

Examples 21–22

Two epoxy encapsulants are prepared from the formulations indicated in Table 5. The two encapsulants differ in the presence/absence of $Bi_2O_3$.

TABLE 5

| Molding Compound | Sample 7 | Sample 8 |
|---|---|---|
| Fused silica filler | 70.99 | 69.39 |
| Carbon black coloring | 0.20 | 0.20 |
| Epoxy Resin | 13.49 | 13.49 |
| Phenol Novolac Hardener | 9.22 | 9.22 |
| Silane coupling agent | 0.70 | 0.70 |
| Catalyst | 0.35 | 0.35 |
| Wax lubricants | 0.45 | 0.45 |
| Brominated epoxy Novolac | 3.80 | 3.80 |
| $WO_3$ | 0.80 | 0.80 |
| $Bi_2O_3$ | — | 1.60 |

Example 23–26

The properties of the cured encapsulants of Samples 2, 4, 7 and 8 are determined by total burn times of 1/16" and of 1/8" bar according to the UL-94V-O test. The test results are summarized in Table 6.

TABLE 6

| Sample # | 1/16" | 1/8" | 1/16" | 1/"8 |
|---|---|---|---|---|
| 2 | 4 sec. | — | pass | — |
| 4 | 31 sec. | — | pass | — |
| 7 | 86 sec. | 27 sec. | fail | pass |
| 8 | 73 sec. | 40 sec. | fail | pass |

Examples 27–30

Figure 3:
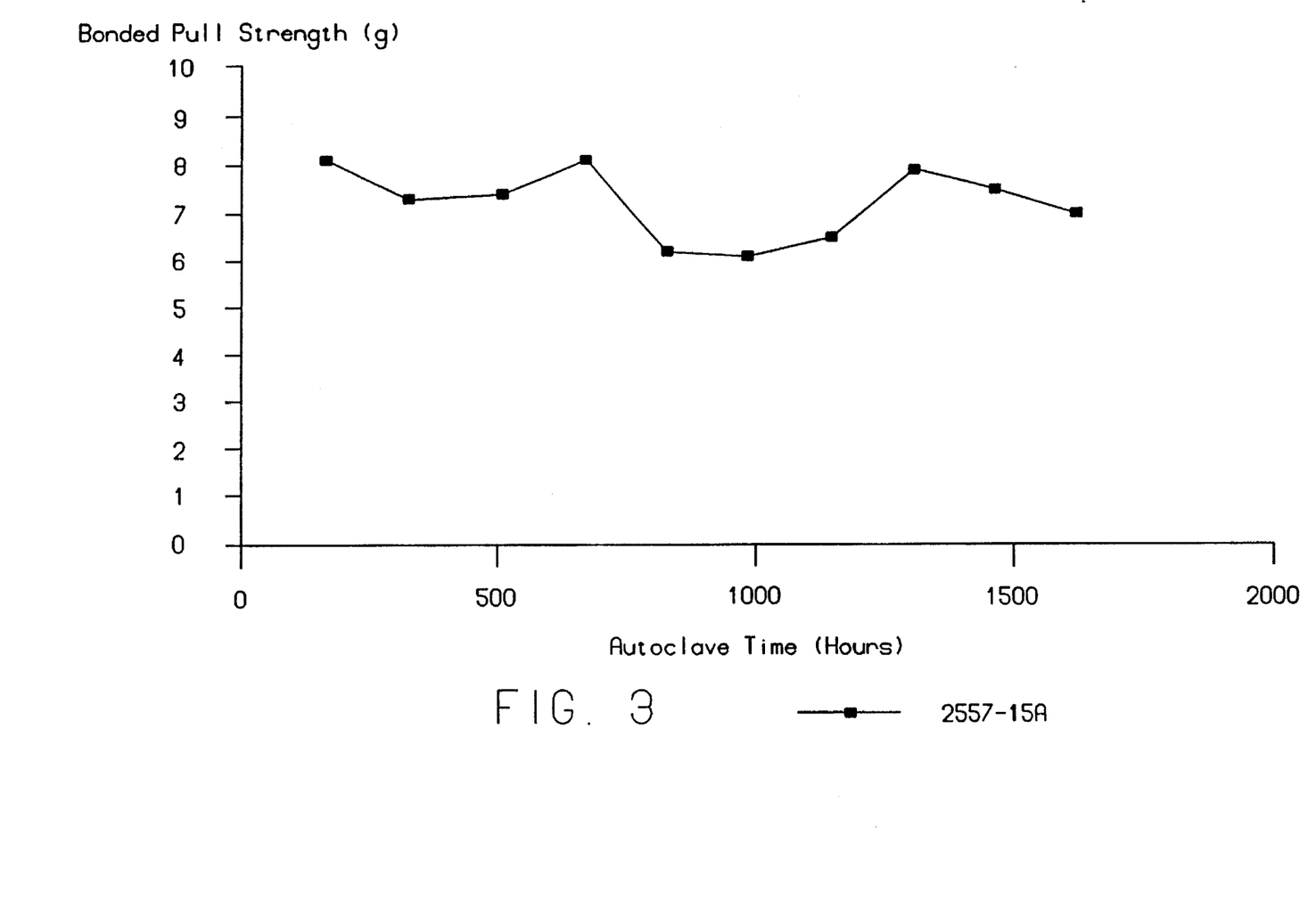
FIG. 3 describes test results of the ball bond degradation test on Example 7 as a function of time and the estimated bond pull strength at 30 psi.
Figure 4:
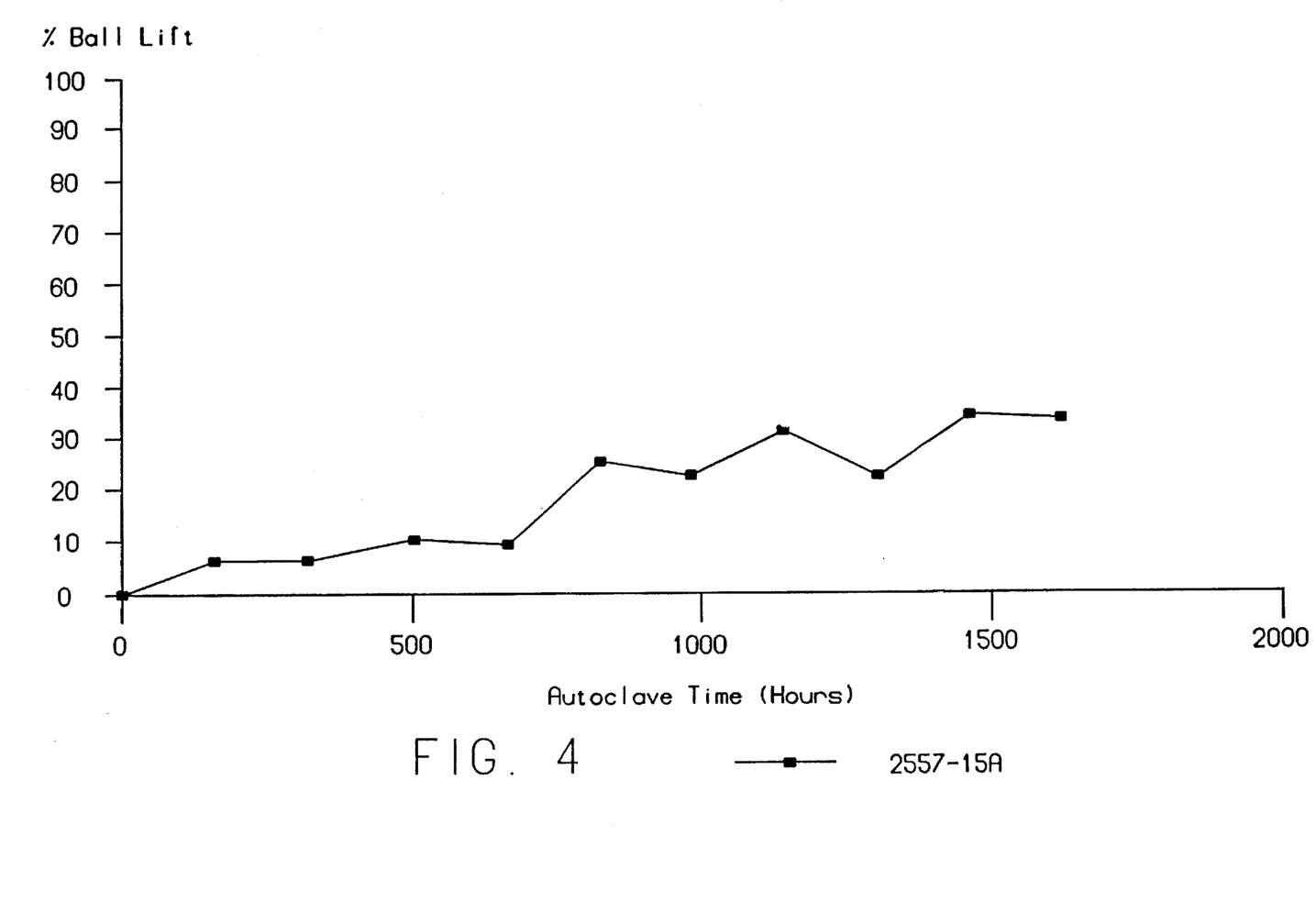
FIG. 4 describes test results of the ball bond degradation test on Example 7 as a function of time and the estimated hours of 50% occurrence of ball lift at 30 psi.

National LF412 operational amplifiers are encapsulated with Samples 2, 4, 7 and 8 and are subjected to the ball bond degradation test as described in Examples 12–17. The test results are summarized in Table 7 and FIGS. 3–4.

TABLE 7

| Sample # | % of original Ball Bond Strength After 1000 hrs. at 30 psi |
|---|---|
| 2 | about 95 |
| 4 | about 95 |
| 7 | about 90 |
| 8 | — |

A review of the data shows that like $Sb_2O_5$ and $MoO_3$, $WO_3$ was found to be flame retardant synergist and protects against ball bond degradation.

Examples 31–32

Epoxy encapsulants are prepared from the formulation indicated in Table 8.

TABLE 8

| Molding Compound | Samples | |
| --- | --- | --- |
|  | 9 | 10 |
| Fused silica filler | 71.29 | 70.99 |
| Carbon black coloring | 0.20 | 0.20 |
| Epoxy Resin | 13.49 | 13.49 |
| Phenolic Novolac Hardener | 9.22 | 9.22 |
| Silane coupling agent | 0.70 | 0.70 |
| Catalyst | 0.35 | 0.35 |
| Wax Lubricants | 0.45 | 0.45 |
| Brominated Epoxy Novolac | 3.80 | 3.80 |
| IXE-600 |  | 0.80 |
| $Sb_2O_5$ | 0.50 | — |

Examples 33–35

5420 devices are encapsulated with the formulations of samples 7, 9 and 10 and are subjected to high temperature storage life (HTSL) testing at 200° C., highly accelerated stress (HAST) testing at 148° C./90% R.H./no bias and the ball bond degradation test. The test results are shown in the Table 9.

TABLE 9

| Sample # | HTSL (200° C.) Hours to 50% failure | | HAST (148° C./90% RH/ no bias) Hours to 50% failure | % of original Ball Bond Strength after 1000 hrs at 30 psi |
| --- | --- | --- | --- | --- |
|  | 250 mV | 400 mV | parametric |  |
| 7 | 451 | 930 | 2650 | about 90 |
| 9 | 540 | 860 | 1500–2200 | about 95 |
| 10 | 180 | 630 | 2770 | about 60 |

A review of the test data show that the $WO_3$ sample showed an improvement in live device performance vis-a-vis $Sb_2O_5$, particularly in the HAST test, while the IXE-600 sample showed unacceptable HTSL results, especially at the 250 mV failure limit, and ball bond degradation.

Examples 36–37

Epoxy encapsulants are prepared from the formulations indicated in Table 10.

TABLE 10

| Molding Compound | Samples | |
| --- | --- | --- |
|  | 11 | 12 |
| Fused silica filler | 78.39 | 78.39 |
| DHT-4A | 0.70 | 0.70 |
| Carbon black coloring | 0.20 | 0.20 |
| Epoxy Resin | 8.30 | 8.30 |
| Phenolic Novolac Hardener | 6.01 | 6.01 |
| Flexibilizers | 1.60 | 1.60 |
| Silane coupling agent | 0.75 | 0.75 |
| Catalyst | 0.35 | 0.35 |
| Wax Lubricants | 0.45 | 0.45 |
| Brominated Epoxy Novolac | 2.50 | 2.50 |
| $Sb_2O_5$ | 0.75 | — |
| $WO_3$ | — | 0.75 |

Examples 38–39

74L500 devices are encapsulated with samples 11 and 12 and are subjected to the T-shock test, the HAST test and the HTSL test. The results are shown in Table 11.

TABLE 11

| | Sample | |
| --- | --- | --- |
| | 11 | 12 |
| T-Shock Cycles to 50% failure | 200 | 245 |
| Live Device, Hours to 50% failure | | |
| HAST 148° C. | 2,410 | 2,880 |
| HAST 158° C. | 1,400 | 1,110 |
| HTSL 190° C. | | |
| 300/350 mV | 1,000 | 1,900 |
| 400/500 mV | 1,300 | about 3,000 |

A review of the test data shows that $WO_3$ gave comparable results to $Sb_2O_5$ in the HAST test, a slight improvement in the T-shock test and, unexpectedly, a substantial improvement in the HTSL test.

Examples 40–42

Epoxy encapsulates are prepared from the formulations indicated in Table 12.

TABLE 12

| Molding Compound | Sample | | |
| --- | --- | --- | --- |
|  | 13 | 14 | 15 |
| Fused silica filler | 78.29 | 78.09 | 77.89 |
| Carbon black coloring | 0.20 | 0.20 | 0.20 |
| Epoxy Resin | 8.30 | 8.30 | 8.30 |
| DHT-4A | 0.70 | 0.70 | 0.70 |
| Phenolic Novolac Hardener | 6.01 | 6.01 | 6.01 |
| Flexibilizers | 1.60 | 1.60 | 1.60 |
| Silane coupling agent | 0.75 | 0.75 | 0.75 |
| Catalyst | 0.35 | 0.35 | 0.35 |
| Wax Lubricants | 0.45 | 0.45 | 0.45 |
| Brominated Epoxy Novolac | 2.50 | 2.50 | 2.50 |
| $WO_3$ | 0.75 | 0.75 | 0.75 |
| $Sb_2O_5$ | 0.10 | 0.30 | 0.50 |

Examples 43–47

Devices encapsulated with Samples 11–15 are subjected to the UL-94V-O test at total burn times of 1/16" and 1/8" bar. The test results are summarized in Table 13.

TABLE 13

| Sample | Total Burn Time 1/8" bar/1/16" bar | | 94V-O Status 1/8" bar/1/16" bar | |
| --- | --- | --- | --- | --- |
| 11 | 5 | 13 | Pass | Pass |
| 12 | 27 | 62 | Pass | Fail |
| 13 | 34 | 67 | Pass | Fail |
| 14 | 16 | 25 | Pass | Pass |
| 15 | 8 | 20 | Pass | Pass |

A review of the test data shows that a system comprising both $WO_3$ and $Sb_2O_5$ is a flame retardant synergist, and the synergistic effect improves as more $Sb_2O_5$ is added to the $WO_3$.

Examples 48–49

74L500 devices are encapsulated with samples 11 and 12 and are subjected to an HTSL test. The packages were stored for a variable number of hours at 190° C. and the cumulative voltage output/low state level failures are recorded. The results are summarized in Table 14.

TABLE 14

High Temperature Storage Life Test (190° C.)
74LS00 Lead Dual In-Line Parts
Using Copper Frames
Cumulative VOL Failures

| Hours | 300/350 mV Samples | | 400/500 mV Samples | |
| --- | --- | --- | --- | --- |
| | 11 | 12 | 11 | 12 |
| 0 | 0/35 | 0/34 | 0/35 | 0/34 |
| 44 | 0/35 | 0/34 | 0/35 | 0/34 |
| 154 | 0/35 | 0/34 | 0/35 | 0/34 |
| 308 | 0/35 | 0/34 | 0/35 | 0/34 |
| 418 | 4/35 | 0/34 | 0/35 | 0/34 |
| 594 | 6/35 | 0/34 | 0/35 | 0/34 |
| 748 | 7/35 | 1/34 | 1/35 | 0/34 |
| 902 | 11/35 | 3/34 | 2/35 | 0/34 |
| 1043 | 20/35 | 4/34 | 3/35 | 1/34 |
| 1197 | — | 5/34 | 7/35 | 1/34 |
| 1351 | — | 14/34 | 19/35 | 3/34 |
| 1505 | — | 16/34 | 22/35 | 6/34 |
| 1659 | — | 17/34 | — | 6/33 |
| 1870 | — | 17/34 | — | 7/33 |
| 2046 | — | 18/34 | — | 7/33 |
| 2178 | — | — | — | 7/33 |
| 2332 | — | — | — | 7/33 |
| 2486 | — | — | — | 8/33 |
| 2640 | — | — | — | 9/33 |
| 2794 | — | — | — | 10/33 |
| 2948 | — | — | — | 10/33 |
| 3102 | — | — | — | 13/33 |
| 3256 | — | — | — | 13/33 |
| 3410 | — | — | — | 16/33 |

A review of the test data shows that $WO_3$ is more effective as a flame retardant synergist in the HTSL test than is $Sb_2O_5$.

The foregoing examples are intended to illustrate without limitation, the improved flame retardant epoxy molding compound, method and encapsulated device. It is understood that changes and variation can be made therein without departing from the scope of the invention as defined in the following claims.

What is claimed is:

1. A method for encapsulating a semiconductor device, said method comprising the steps of:
   (1) heating a thermosetting epoxy molding compound to a liquid state, and
   (2) encapsulating a semiconductor device with said thermosetting epoxy molding compound heated to a liquid state, and
   (3) cooling said encapsulated semiconductor device wherein said epoxy molding comprises:
      (a) about 5–25 percent by weight of compound of an epoxy;
      (b) about 4–20 percent by weight of compound of a resin hardener;
      (c) an effective amount of a catalyst for the reaction between said epoxy resin and said hardener in an amount of from about 0.1 to 10% by weight of the combined weight of epoxy and hardener;
      (d) an effective amount of a mold release agent for the release of the cured molding compound from a mold in an amount of between about 0.01 and about 2 percent by weight of compound;
      (e) between about 50 and 85 percent by weight of compound of a filler; and
      (f) a flame retardant system of:
         (1) a refractory metal oxide;
         (2) a reactive organic compound containing halogen, said reactive organic compound being a separate compound or being contained in one or more of said components (a)–(e) of said epoxy molding compound.

2. The method of claim 1, wherein said epoxy is about 10–17 percent by weight of the epoxy molding compound.

3. The method of claim 1 wherein said hardener is a phenolic novolac.

4. The method of claim 1 wherein said hardener is an anhydride.

5. The method of claim 1 wherein said hardener is a polyanhydride of a maleic monomer and at least one alkyl styrene monomer or prepolymer of the polyanhydride and the epoxy resin.

6. The method of claim 1 wherein said epoxy molding compound comprises at least about 50 weight percent of an inorganic filler.

7. The method of claim 6 wherein said inorganic filler includes silica.

8. The method of claim 7 wherein said epoxy molding compound comprises between about 60 and about 80 weight percent inorganic filler.

9. The method of claim 1 wherein said epoxy molding compound includes a silane coupling agent.

10. The method according to claim 1 wherein said epoxy molding compound includes a colorant.

11. The method of claim 1 wherein said reactive organic compound containing halogen is a bromophenol-formaldehyde novolac.

12. The method of claim 1 wherein said reactive organic compound containing halogen is a polyglycidyl ether of bromophenol-formaldehyde novolac.

13. The method according to claim 1, wherein said reactive organic compound containing halogen is a bromophenol epoxy novolac.

14. The method according to claim 1, wherein said reactive organic compound containing halogen is a meta-brominated cresol epoxy novolac.

15. The method according to claim 1, wherein said reactive organic compound containing halogen is part of said epoxy.

16. The method according to claim 1, wherein said reactive organic compound containing a halogen is part of said resin hardener.

17. The method according to claim 1, wherein said reactive organic compound containing halogen contains about 0.5–1.5 percent of halogen by weight of the molding compound.

18. The method according to claim 1, wherein said refractory metal oxide is an oxidizing metal oxide of an element selected from Group VIA of the Periodic Table.

19. The method according to claim 18, wherein said oxidizing metal oxide of an element selected from Group VIA of the Periodic Table is tungsten trioxide.

20. The method according to claim 18, wherein said oxidizing metal oxide of an element selected from Group VIA of the Periodic Table is molybdenum trioxide.

21. The method according to claim 1, wherein said flame retardant system includes about 0.4–2.0 percent of an oxidizing refractory metal oxide.

22. The method according to claim 1, wherein said flame retardant system includes about 0.40–0.80 percent of antimony pentoxide by weight of the molding compound.

23. The method according to claim 22, wherein said flame retardant system contains about 0.03–0.06 percent of sodium by weight of the antimony pentoxide.

24. The method according to claim 22, wherein the said flame retardant system contains about 0.02–3.20 percent of magnesium aluminum carbonate hydrate by weight of the molding compound.

25. The method of claim 1 wherein said semiconductor device is a treated silicon wafer.

26. The method of claim 1 wherein said semiconductor device is selected from the group consisting of transistors, diodes and integrated circuits.

27. A semiconductor device encapsulated by the method of claim 1.

28. A semiconductor device encapsulated by the method of claim 3.

29. A semiconductor device encapsulated by the method of claim 6.

30. A semiconductor device encapsulated by the method of claim 14.

31. A semiconductor device encapsulated by the method of claim 18.

32. A semiconductor device encapsulated by the method of claim 19.

33. A semiconductor device encapsulated by the method of claim 20.

34. A semiconductor device encapsulated by the method of claim 21.

* * * * *